United States Patent
Liu

(10) Patent No.: US 10,566,458 B2
(45) Date of Patent: Feb. 18, 2020

(54) ARRAY SUBSTRATE AND METHOD FOR MANUFACTURING THE SAME

(71) Applicant: Shenzhen China Star Optoelectronics Technology Co., Ltd., Shenzhen (CN)

(72) Inventor: Yang Liu, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 6 days.

(21) Appl. No.: 14/897,677

(22) PCT Filed: Sep. 1, 2015

(86) PCT No.: PCT/CN2015/088713
§ 371 (c)(1),
(2) Date: Jan. 30, 2018

(87) PCT Pub. No.: WO2017/024640
PCT Pub. Date: Feb. 16, 2017

(65) Prior Publication Data
US 2018/0158953 A1    Jun. 7, 2018

(30) Foreign Application Priority Data
Aug. 10, 2015   (CN) .......................... 2015 1 0487237

(51) Int. Cl.
*G02F 1/1368*    (2006.01)
*G02F 1/1343*    (2006.01)
(Continued)

(52) U.S. Cl.
CPC ........ *H01L 29/7869* (2013.01); *G02F 1/1368* (2013.01); *G02F 1/13439* (2013.01);
(Continued)

(58) Field of Classification Search
CPC ............... H01L 29/7869; H01L 27/124; H01L 27/1225; H01L 27/127; H01L 27/1288;
(Continued)

(56) References Cited

U.S. PATENT DOCUMENTS 5,640,216 A * 6/1997 Hasegawa ............. G02F 1/1345
349/58
9,165,830 B1 * 10/2015 Yoo ......................... H01L 21/77
(Continued)

FOREIGN PATENT DOCUMENTS

CN   101425543 A   5/2009
CN   102473362 A   5/2012
(Continued)

OTHER PUBLICATIONS

Notification of Transmittal of the International Search Report and the Written Opinion of the International Searching Authority (Forms PCT/ISA/220, PCT/ISA/237, and PCT/ISA/210) dated Apr. 27, 2016, by the State Intellectual Property Office of People's Republic of China in corresponding International Application No. PCT/CN2015/088713. (11 pages).
(Continued)

*Primary Examiner* — Steven H Loke
*Assistant Examiner* — Juanita B Rhodes
(74) *Attorney, Agent, or Firm* — Mintz Levin Cohn Ferris Glovsky and Popeo, P.C.; Steven M. Jensen

(57) ABSTRACT

Disclosed are an array substrate and a method for manufacturing the same, which belong to the technical field of display, and are able to solve the technical problem that the existing process for manufacturing array substrates is too complex. The array substrate includes a plurality of sub-pixel units formed on a base substrate. Each of the sub-pixel units comprises a thin film transistor and a second pixel electrode. An active layer of the thin film transistor is made
(Continued)

of an oxide semiconductor. The second pixel electrode is made of a plasma treated transparent oxide semiconductor. The array substrate provided by the present disclosure can be used in an IPS or FFS liquid crystal display device.

9 Claims, 3 Drawing Sheets

(51) Int. Cl.
*G02F 1/1362* (2006.01)
*H01L 27/12* (2006.01)
*H01L 29/786* (2006.01)
*G02F 1/1333* (2006.01)

(52) U.S. Cl.
CPC .. *G02F 1/133345* (2013.01); *G02F 1/134309* (2013.01); *G02F 1/134363* (2013.01); *G02F 1/136286* (2013.01); *H01L 27/124* (2013.01); *H01L 27/127* (2013.01); *H01L 27/1225* (2013.01); *H01L 27/1248* (2013.01); *H01L 27/1288* (2013.01); *G02F 2001/134372* (2013.01); *G02F 2001/136231* (2013.01)

(58) Field of Classification Search
CPC ............. H01L 27/1248; H01L 27/1259; G02F 1/13439; G02F 1/134363; G02F 1/136286; G02F 1/134309; G02F 1/133345; G02F 1/1368; G02F 2001/136231; G02F 2001/134372
See application file for complete search history.

(56) References Cited

U.S. PATENT DOCUMENTS

| 2006/0146245 | A1* | 7/2006 | Ahn ................... G02F 1/134363 349/139 |
| 2010/0210056 | A1 | 8/2010 | Seo et al. |
| 2012/0108018 | A1 | 5/2012 | Okabe et al. |
| 2012/0217495 | A1 | 8/2012 | Kwak et al. |
| 2013/0200385 | A1* | 8/2013 | Jia ........................ G02F 1/1362 257/72 |
| 2014/0159034 | A1* | 6/2014 | Yang ................... H01L 27/1296 257/43 |
| 2016/0293628 | A1 | 10/2016 | Ning |

FOREIGN PATENT DOCUMENTS

| CN | 102929062 A | | 2/2013 |
| CN | 103021959 A | | 4/2013 |
| CN | 103235458 A | | 8/2013 |
| CN | 104217994 A | | 12/2014 |
| CN | 102929062 B | * | 7/2015 |
| KR | 10-2013-0036681 A | | 4/2013 |
| KR | 20130036681 A | * | 4/2013 |

OTHER PUBLICATIONS

Office Action dated Aug. 18, 2017 by the State Intellectual Property Office of People's Republic of China in corresponding Chinese Patent Application No. 201510487237. (8 pages).

* cited by examiner

S1: form a first pixel electrode, a scan line, a common electrode line, and a gate on a base substrate
    S11: form a transparent electrode layer and a first metal layer on the base substrate
    S12: coat the first metal layer with photoresist, expose and develop with a half-tone mask, a gray-tone mask, or a single-slit mask
    S13: etch the first metal layer and the transparent electrode layer to form the scan line, the common electrode line, and the gate
    S14: ash the photoresist
    S15: etch the first metal layer to form the first pixel electrode
    S16: remove the residual photoresist

S2: form a gate insulating layer

S3: form a data line and a source on the gate insulating layer
    S31: form an oxide semiconductor layer and a second metal layer on the gate insulating layer
    S32: coat the second metal layer with photoresist, expose and develop with a half-tone mask, a gray-tone mask, or a single-slit mask
    S33: etch the second metal layer and the oxide semiconductor layer to form the data line and the source
    S34: ash the photoresist
    S35: etch the second metal layer to form the oxide semiconductor pattern
    S36: remove the residual photoresist

S4: form a passivation layer

S5: etch the passivation layer to expose the second pixel electrode pattern
    S51: coat the passivation layer with photoresist, expose and develop with a mask
    S52: etch the passivation layer to expose the second pixel electrode pattern of the oxide semiconductor pattern
    S53: remove the residual photoresist

S6: perform plasma treatment to form a second pixel electrode

Fig. 3 ant patent application CN201510487237.1, entitled "Array substrate and method for manufacturing the same" and filed on Aug. 10, 2015, the entirety of which is incorporated herein by reference.

ARRAY SUBSTRATE AND METHOD FOR MANUFACTURING THE SAME

CROSS-REFERENCE TO RELATED APPLICATIONS

The present application claims the priority of Chinese patent application CN201510487237.1, entitled "Array substrate and method for manufacturing the same" and filed on Aug. 10, 2015, the entirety of which is incorporated herein by reference.

TECHNICAL FIELD

The present disclosure relates to the technical field of display, and in particular, to an array substrate and a method for manufacturing the same.

TECHNICAL BACKGROUND

With the development of display technology, liquid crystal display devices have become the most common display device.

According to in-plane switching (IPS) technology and fringe field switching (FFS) technology, a first pixel electrode and a second pixel electrode are both arranged on an array substrate so that liquid crystals can be driven by an electric field in a horizontal direction. Therefore, an IPS or FFS liquid crystal display device has advantages such as wide viewing angle, high brightness, high contrast, quick response, etc.

However, when manufacturing an IPS or FFS liquid crystal display device, an array substrate is usually formed by forming a gate metal layer, an active layer, a source-drain metal layer, a first transparent electrode layer, a via hole pattern, and a second transparent electrode layer in altogether six photoengraving processes, which renders the manufacturing process too complex.

SUMMARY OF THE INVENTION

The objective of the present disclosure is to provide an array substrate and a method for manufacturing the same, so as to solve the technical problem that the existing process for manufacturing array substrates is too complex.

The present disclosure provides a method for manufacturing an array substrate. The method comprises steps of: forming a scan line, a common electrode line, a gate of a thin film transistor, and a first pixel electrode on a base substrate; providing a gate insulating layer; forming an oxide semiconductor pattern, a data line, and a source of the thin film transistor on the gate insulating layer, wherein the oxide semiconductor pattern comprises an active layer of the thin film transistor, and a second pixel electrode pattern; providing a passivation layer; etching the passivation layer, so as to expose the second pixel electrode pattern of the oxide semiconductor pattern; and performing plasma treatment on the second pixel electrode pattern of the oxide semiconductor pattern, so as to form a second pixel electrode.

Further, the step of performing plasma treatment on the second pixel electrode pattern of the oxide semiconductor pattern specifically comprises: performing plasma treatment on the second pixel electrode pattern of the oxide semiconductor pattern with $SF_6$, $N_2$, Ar or He.

Preferably, the step of forming the scan line, the common electrode line, the gate of the thin film transistor, and the first pixel electrode on the base substrate specifically comprises: forming a transparent electrode layer and a first metal layer in turn on the base substrate; coating the first metal layer with photoresist, exposing and developing the photoresist with a half-tone mask, a gray-tone mask, or a single-slit mask; etching the first metal layer and the transparent electrode layer, so as to form the scan line, the common electrode line, and the gate of the thin film transistor; ashing the photoresist; etching the first metal layer, so as to form the first pixel electrode; and removing the residual photoresist.

Preferably, the step of forming the oxide semiconductor pattern, the data line, and the source of the thin film transistor on the gate insulating layer specifically comprises: forming an oxide semiconductor layer and a second metal layer in turn on the gate insulating layer; coating the second metal layer with photoresist, exposing and developing the photoresist with a half-tone mask, a gray-tone mask, or a single-slit mask; etching the second metal layer and the oxide semiconductor layer, so as to form the data line and the source of the thin film transistor; ashing the photoresist; etching the second metal layer, so as to form the oxide semiconductor pattern; and removing the residual photoresist.

Preferably, the step of etching the passivation layer, so as to expose the second pixel electrode pattern of the oxide semiconductor pattern, specifically comprises: coating the passivation layer with photoresist, exposing and developing the photoresist with a mask; etching the passivation layer, so as to expose the second pixel electrode pattern of the oxide semiconductor pattern; and removing the residual photoresist.

Further, the step of etching the passivation layer specifically comprises: etching the passivation layer with sulfur hexafluoride.

The present disclosure further provides an array substrate which comprises a plurality of sub-pixel units formed on a base substrate. Each of the sub-pixel units comprises a thin film transistor and a second pixel electrode. An active layer of the thin film transistor is located at a same layer as the second pixel electrode. The active layer is made of an oxide semiconductor. The second pixel electrode is made of a plasma treated transparent oxide semiconductor.

Further, a gate of the thin film transistor is formed on the base substrate, and the active layer is located above the gate. A gate insulating layer is formed between the active layer and the gate. A source of the thin film transistor is formed on the active layer.

Further, the array substrate further comprises a common electrode line, a scan line, and a data line. The common electrode line and the scan line are located at a same layer as the gate, and the data line is located at a same layer as the source.

Further, the array substrate further comprises a first pixel electrode formed on the base substrate.

The present disclosure can bring the following beneficial effects. In the array substrate provided by the present disclosure, the active layer and the second pixel electrode are located at a same layer. The second pixel electrode is made of a plasma treated transparent oxide semiconductor, and the active layer is made of an oxide semiconductor. Consequently, in the process of manufacturing the array substrate, the oxide semiconductor pattern comprising the active layer and the second pixel electrode pattern can be formed in one photoengraving process. After that, plasma treatment can be performed on the second pixel electrode pattern so that the conductivity of the oxide semiconductor can be improved to meet the requirement of a pixel electrode for conductivity, thus forming the second pixel electrode. It can thus be seen that the technical solution provided by the present disclosure is able to reduce the number of photoengraving processes, thereby solving the technical problem that the existing process for manufacturing array substrates is too complex, further enhancing productivity, and reducing production cost.

Other features and advantages of the present disclosure will be further explained in the following description, and will partly become self-evident therefrom, or be understood through the implementation of the present disclosure. The objectives and advantages of the present disclosure will be achieved through the structures specifically pointed out in the description, claims, and the accompanying drawings.

BRIEF DESCRIPTION OF THE DRAWINGS

For further illustrating the technical solutions provided in the embodiments of the present disclosure, a brief introduction will be given below to the accompanying drawings involved in the embodiments.

FIG. 3 is a flow chart for a method of manufacturing an array substrate according to an embodiment of the present disclosure.

DETAILED DESCRIPTION OF THE EMBODIMENTS

The present disclosure will be explained in detail below with reference to the embodiments and the accompanying drawings, so that one can fully understand how the present disclosure solves the technical problem and achieves the technical effects through the technical means, thereby implementing the same. It should be noted that as long as there is no structural conflict, any of the embodiments and any of the technical features thereof may be combined with one another, and the technical solutions obtained therefrom all fall within the scope of the present disclosure.

The present embodiment provides an array substrate which can be used in an IPS or FFS liquid crystal display device. The array substrate a plurality of sub-pixel units formed on a base substrate. Each of the sub-pixel units comprises a thin film transistor, a first pixel electrode, and a second pixel electrode. The array substrate further comprises common electrode lines and scan lines each corresponding to a row of the sub-pixel units, and data lines each corresponding to a column of the sub-pixel units.

Figure 1:
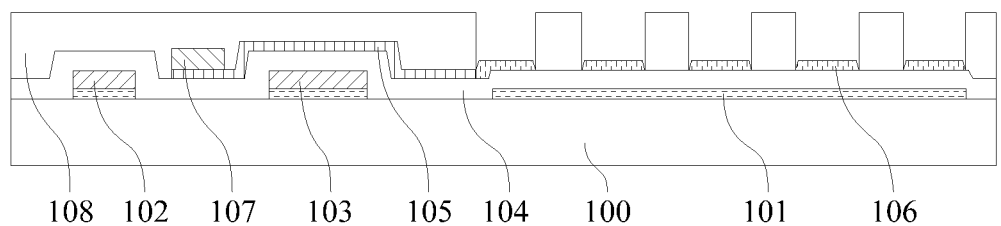
FIG. 1 schematically shows an array substrate according to the embodiments of the present disclosure.

As shown in FIG. 1, the first pixel electrode 101 is formed directly on the base substrate 100 by etching a transparent electrode layer 110.

The common electrode line 102, the scan line 11, and a gate 103 of the thin film transistor 10 are located at a same layer, and are all formed by etching a first metal layer 120 which is provided on the transparent electrode layer 110. It can also be understood that the common electrode line 102, the scan line 11, and the gate 103 are formed by etching the transparent electrode layer 110 and the first metal layer 120, and are provided on the base substrate 100.

An active layer 105 of the thin film transistor 10 is located above the gate 103, and a gate insulating layer 104 is formed between the active layer 105 and the gate 103. In addition, the first pixel electrode 101, the common electrode line 102, and the scan line 11, are all covered with the gate insulating layer 104.

In the present embodiment, the active layer 105 and the second pixel electrode 106 are located at a same layer. The active layer 105 is made of an oxide semiconductor, and the second pixel electrode 106 is made of a plasma treated transparent oxide semiconductor.

A source 107 of the thin film transistor 10 is formed on the active layer 105. The scan line 11 and the source 107 are located at a same layer and formed by etching a second metal layer 170. Besides, the data line 12, the source 107, and the active layer 105 are all covered with a passivation layer 108.

In the array substrate provided by the present embodiment, the active layer 105 and the second pixel electrode 106 are located at a same layer. The second pixel electrode 106 is made of a plasma treated transparent oxide semiconductor, and the active layer 105 is made of an oxide semiconductor. Consequently, in the process of manufacturing the array substrate, an oxide semiconductor pattern comprising the active layer 105 and a second pixel electrode pattern 160 can be formed in one photoengraving process. After that, plasma treatment can be performed on the second pixel electrode pattern 160 so that the conductivity of the oxide semiconductor can be improved to meet the requirement of a pixel electrode for conductivity, thus forming the second pixel electrode 106. In this manner, during the process of manufacturing an array substrate, the number of photoengraving processes can be decreased, which therefore solves the technical problem that the existing process for manufacturing array substrates is too complex, and further enhances productivity, and reduces production cost.

In addition, in the present embodiment, the active layer 105 and the second pixel electrode 106 are directly connected to each other, which enables signal on the data line 12 to be written directly onto the second pixel electrode 106, thus rendering it unnecessary to form a drain from a metal material. Therefore, the array substrate provided by the present embodiment is also able to improve the aperture ratio of the sub-pixel units.

The present disclosure further provides a method for manufacturing the above array substrate which comprises the following steps.

In step S1, a first pixel electrode 101, a scan line 11, a common electrode line 102, and a gate 103 of a thin film transistor 10 are formed on a base substrate 100.

The scan line 11, the common electrode line 102, the gate 103, and the first pixel electrode 101 can be formed in a same photoengraving process, which can be achieved as follows.

Figure 2A:
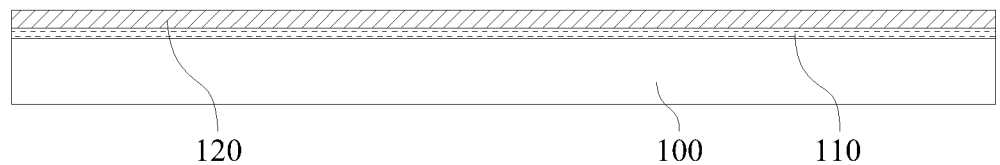
FIG. 2a schematically shows the formation of a transparent electrode layer and a first metal layer in the process of manufacturing the array substrate according to the embodiments of the present disclosure.

In step S11, as shown in FIG. 2a, a transparent electrode layer 110 and a first metal layer 120 are formed in turn on the base substrate 100.

The transparent electrode layer 110 can be made of indium tin oxid (ITO), indium zinc oxide (IZO), aluminium oxide (AZO), etc., and can have a thickness of between 100 Å to 1000 Å. The first metal layer 120 can be made of aluminum (Al), molybdenum (Mo), copper (Cu), silver (Ag), etc., and can have a thickness of between 3000 Å to 5000 Å.

In step S12, the first metal layer 120 is coated with photoresist which is then exposed and developed with a half-tone mask, a gray-tone mask, or a single-slit mask.

After the exposure and development, the photoresist on areas corresponding to the scan line 11, the common electrode line 102, and the gate 103, is all kept, and the photoresist on an area corresponding to the first pixel electrode 101 is partly removed. The rest of the photoresist is all removed.

In step S13, the first metal layer 120 and the transparent electrode layer 110 are etched to form the scan line 11, the common electrode line 102, and the gate 103 of the thin film transistor 10.

The scan line 11, the common electrode line 102, and the gate 103 are all formed by etching the first metal layer 120 and the transparent electrode layer 110. Besides, in this case, the first pixel electrode 101 is already shaped, but is still covered with the first metal layer 120.

In step S14, the photoresist is ashed.

The photoresist on the area corresponding to the first pixel electrode 101 is all removed by ashing. Meanwhile, the photoresist on the areas corresponding to the scan line 11, the common electrode line 102, and the gate 103 are partly removed.

In step S15, the first metal layer 120 is etched to form the first pixel electrode 101.

The first pixel electrode 101 can be formed by etching away the first metal layer 120 covered thereon.

In step S16, the residual photoresist is removed.

Figure 2B:
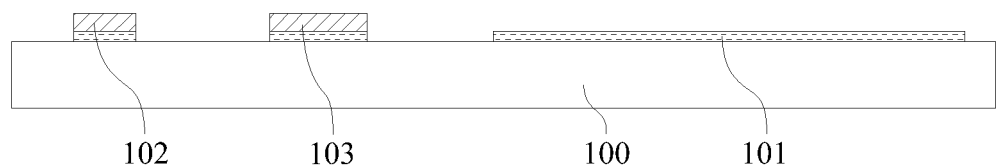
FIG. 2b schematically shows the formation of a scan line, a common electrode line, a gate, and a first pixel electrode in the process of manufacturing the array substrate according to the embodiments of the present disclosure.

As shown in FIG. 2b, after the first photoengraving process, the first pixel electrode 101, the scan line 11, the common electrode line 102, and the gate 103 are formed.

Figure 2C:
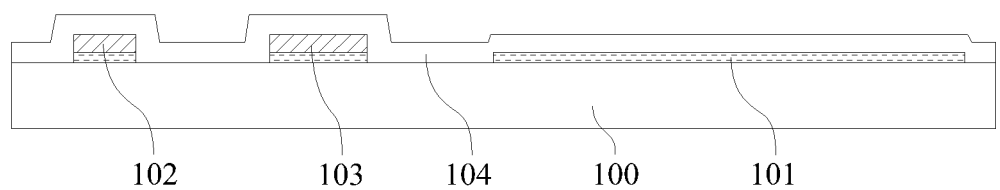
FIG. 2c schematically shows the formation of a gate insulating layer in the process of manufacturing the array substrate according to the embodiments of the present disclosure.

In step S2, as shown in FIG. 2c, after the above steps, a gate insulating layer 104 is provided.

The gate insulating layer 104 can be made of silicon oxide (SiOx), silicon nitride (SiNx), or a mixture of both silicon oxide (SiOx) and silicon nitride (SiNx), and can have a thickness of between 2000 Å to 5000 Å.

In step S3, an oxide semiconductor pattern, a data line 12, and a source 107 of the thin film transistor 10 are formed on the gate insulating layer 104.

The oxide semiconductor pattern comprises an active layer 105 of the thin film transistor 10, and a second pixel electrode pattern 160. In the present embodiment, the oxide semiconductor pattern, the data line 12, and the source 107 of the thin film transistor 10 can be formed in a same photoengraving process, which can be achieved specifically as follows.

Figure 2D:
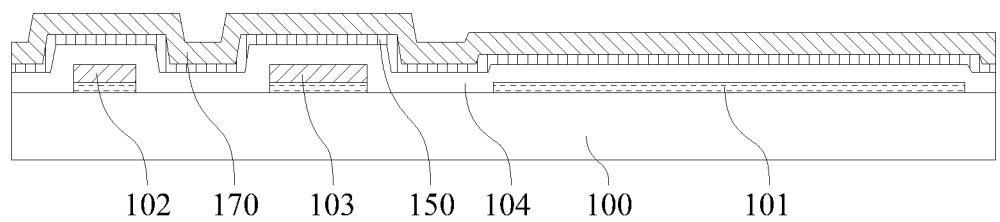
FIG. 2d schematically shows the formation of an oxide semiconductor layer and a second metal layer in the process of manufacturing the array substrate according to the embodiments of the present disclosure.

In step S31, as shown in FIG. 2d, an oxide semiconductor layer 150 and a second metal layer 170 are formed in turn on the gate insulating layer 104.

The oxide semiconductor layer 150 can be made of a transparent oxide semiconductor such as ZnO based material, $SnO_2$ based material, $In_2O_3$ based material, etc., and can have a thickness of between 200 Å to 2000 Å. The material and thickness of the second metal layer 170 can be the same as those of the first metal layer 120.

In step S32, the second metal layer 170 is coated with photoresist which is then exposed and developed with a half-tone mask, a gray-tone mask, or a single-slit mask.

After the exposure and development, the photoresist on areas corresponding to the data line 12 and the source 107 is all kept, and the photoresist on an area corresponding to the oxide semiconductor pattern is partly removed. The rest of the photoresist is all removed.

In step S33, the second metal layer 170 and the oxide semiconductor layer 150 are etched to form the data line 12 and the source 107 of the thin film transistor 10.

The data line 12 and the source 107 are all formed by etching the second metal layer 170. Besides, in this case, the oxide semiconductor pattern is already shaped, but is still covered with the second metal layer 170.

In step S34, the photoresist is ashed.

The photoresist on an area corresponding to the oxide semiconductor pattern is all removed by ashing. Meanwhile, the photoresist on areas corresponding to the data line 12 and the source 107 are partly removed.

In step S35, the second metal layer 170 is etched to form the oxide semiconductor pattern.

The oxide semiconductor pattern can be formed by etching away the second metal layer 170 covered thereon.

In step S36, the residual photoresist is removed.

Figure 2E:
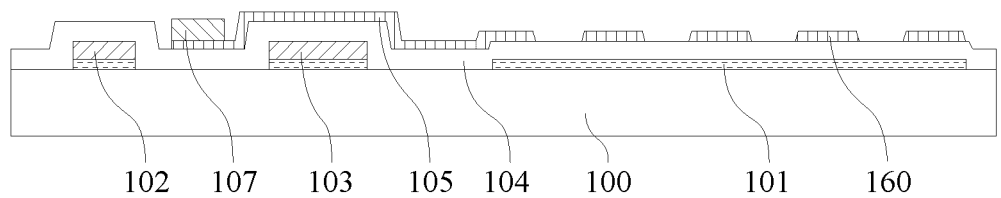
FIG. 2e schematically shows the formation of an oxide semiconductor pattern, a data line, and a source in the process of manufacturing the array substrate according to the embodiments of the present disclosure.

As shown in FIG. 2e, after the second photoengraving process, the oxide semiconductor pattern, the data line 12, and the source 107 are formed. The oxide semiconductor pattern comprises the active layer 105 of the thin film transistor 10 and a second pixel electrode pattern 160.

Figure 2F:
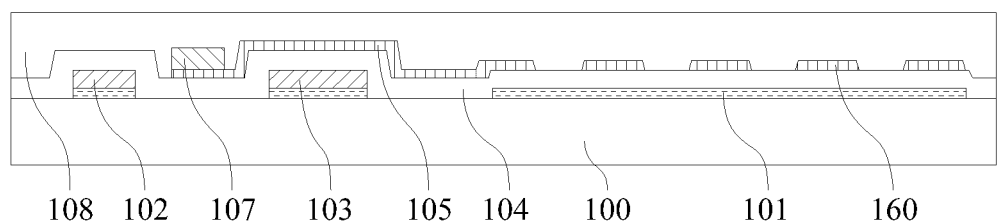
FIG. 2f schematically shows the formation of a passivation layer in the process of manufacturing the array substrate according to the embodiments of the present disclosure.

In step S4, as shown in FIG. 2f, after the above steps, a passivation layer 108 is provided.

The passivation layer 108 can be made of silicon oxide (SiOx), silicon nitride (SiNx), or a mixture of both silicon oxide (SiOx) and silicon nitride (SiNx), and can have a thickness of between 2000 Å to 5000 Å.

In step S5, the passivation layer 108 is etched to expose the second pixel electrode pattern 160 of the oxide semiconductor pattern, which is specifically achieved by the following steps.

In step S51, the passivation layer 108 is coated with photoresist which is then exposed and developed with a mask.

After the exposure and development, the photoresist on an area corresponding to the second pixel electrode pattern 160 is removed, and the rest of the photoresist is kept.

In step S52, the passivation layer 108 is etched to expose the second pixel electrode pattern 160 of the oxide semiconductor pattern.

The oxide semiconductor pattern is exposed by etching an area of the passivation layer 108 corresponding to the second pixel electrode pattern 160 with sulfur hexafluoride ($SF_6$).

In step S53, the residual photoresist is removed.

Figure 2G:
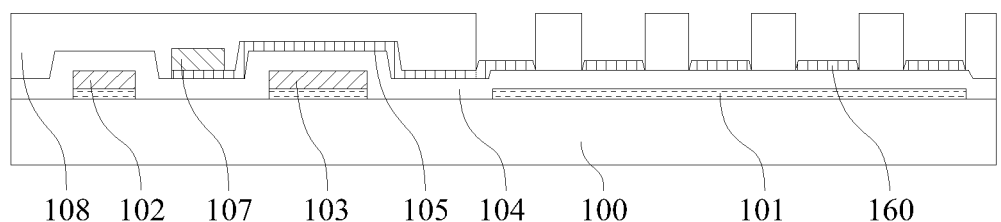
FIG. 2g schematically shows the formation of a passivation layer and a second pixel electrode pattern in the process of manufacturing the array substrate according to the embodiments of the present disclosure.

As shown in FIG. 2g, after the third photoengraving process, the pattern of the passivation layer 108 is formed, and the second pixel electrode pattern 160 is exposed.

In step S6, plasma treatment is performed on the second pixel electrode pattern 160 of the oxide semiconductor pattern, so as to form a second pixel electrode 106.

The plasma treatment can be performed on the second pixel electrode pattern 160 by using $SF_6$, $N_2$, Ar, and He as plasma, so that the conductivity of the transparent oxide semiconductor can be improved to meet the requirement of a pixel electrode for conductivity, thus forming the second pixel electrode 106. $SF_6$ can be used not only in etching of the passivation layer 108, but also in the plasma treatment on the second pixel electrode pattern 160. Besides, in order to improve effects of the plasma treatment, $N_2$, Ar, and He are added into $SF_6$.

As shown in FIG. 1, after the above steps, an array substrate provided by the present disclosure can be formed. In the method for manufacturing the array substrate provided by the present disclosure, only three photoengraving processes are used, which therefore solves the technical problem that the existing process for manufacturing array substrates is too complex, thereby enhancing the productivity, and reducing the production cost.

It should be noted that in other embodiments of the present disclosure, the first pixel electrode 101 can be formed in a separate photoengraving process, and the scan line 11, the common electrode line 102, and the gate 103 can be formed in another photoengraving process. In this case, the process of manufacturing the array substrate will comprise altogether four photoengraving processes, which, compared with the six photoengraving processes used in the existing technologies, is still a simplification of the process of manufacturing the array substrate.

The above embodiments are described only for better understanding, rather than restricting the present disclosure. Anyone skilled in the art can make amendments to the implementing forms or details without departing from the spirit and scope of the present disclosure. The scope of the present disclosure should still be subject to the scope defined in the claims.

The invention claimed is:

1. A method for manufacturing an array substrate, comprising steps of:
    forming a scan line, a common electrode line, a gate of a thin film transistor, and a first pixel electrode on a base substrate;
    forming a gate insulating layer;
    forming an oxide semiconductor pattern, a data line, and a source of the thin film transistor on the gate insulating layer, wherein the oxide semiconductor pattern comprises an active layer of the thin film transistor, and a second pixel electrode pattern;
    forming a passivation layer;
    etching the passivation layer, so as to expose the second pixel electrode pattern of the oxide semiconductor pattern and allow the source and the active layer of the thin film transistor to remain covered by the passivation layer; and
    performing plasma treatment on the second pixel electrode pattern of the oxide semiconductor pattern after the forming and etching the passivation layer, so as to form a second pixel electrode, wherein the source and the active layer of the thin film transistor are masked by the passivation layer and protected from the plasma treatment.

2. The method according to claim 1, wherein the step of performing plasma treatment on the second pixel electrode pattern of the oxide semiconductor pattern specifically comprises:
    performing plasma treatment on the second pixel electrode pattern of the oxide semiconductor pattern with $SF_6$, $N_2$, Ar or He.

3. The method according to claim 1, wherein the step of forming the scan line, the common electrode line, the gate of the thin film transistor, and the first pixel electrode on the base substrate, specifically comprises sub steps of:
    forming a transparent electrode layer and a first metal layer in sequence on the base substrate;
    coating the first metal layer with a photoresist, exposing and developing the photoresist with a half-tone mask, a gray-tone mask, or a single-slit mask;
    etching the first metal layer and the transparent electrode layer, so as to form the scan line, the common electrode line, and the gate of the thin film transistor;
    ashing the photoresist;
    etching the first metal layer, so as to form the first pixel electrode; and
    removing residual photoresist.

4. The method according to claim 1, wherein the step of forming the oxide semiconductor pattern, the data line, and the source of the thin film transistor on the gate insulating layer, specifically comprises sub steps of:
    forming an oxide semiconductor layer and a second metal layer in sequence on the gate insulating layer;
    coating the second metal layer with a photoresist, exposing and developing the photoresist a with a half-tone mask, a gray-tone mask, or a single-slit mask;
    etching the second metal layer and the oxide semiconductor layer, so as to form the data line and the source of the thin film transistor;
    ashing the photoresist;
    etching the second metal layer, so as to form the oxide semiconductor pattern; and
    removing residual photoresist.

5. The method according to claim 1, wherein the step of etching the passivation layer, so as to expose the second pixel electrode pattern of the oxide semiconductor pattern, specifically comprises sub steps of:
    coating the passivation layer with a photoresist, exposing and developing the photoresist with a mask;
    etching the passivation layer, so as to expose the second pixel electrode pattern of the oxide semiconductor pattern; and
    removing residual photoresist.

6. The method according to claim 5, wherein the step of etching the passivation layer specifically is:
    etching the passivation layer with sulfur hexafluoride.

7. An array substrate, comprising:
    a base substrate;
    a scan line, a common electrode line, a gate of a thin film transistor, and a first pixel
    electrode disposed on the base substrate;
    a gate insulating layer that covers the scan line, the common electrode line, the gate of the
    thin film transistor, the first pixel electrode, and the base substrate;
    an oxide semiconductor pattern, a data line, and a source of the thin film transistor disposed
    on the gate insulating layer, wherein the oxide semiconductor pattern comprises an active layer of
    the thin film transistor and a second pixel electrode; and
    a passivation layer that covers the active layer and the source of the thin film transistor and exposes the second pixel electrode,
    wherein the active layer of the thin film transistor is located at a same layer as the second pixel electrode, the active layer of the thin film transistor being made of an oxide semiconductor, and the second pixel electrode being made of a plasma treated transparent oxide semiconductor.

8. The array substrate according to claim 7, wherein the active layer of the thin film transistor is located above the gate.

9. The array substrate according to claim 7, wherein the common electrode line and the scan line are both located at a same layer as the gate; and
wherein the data line is located at a same layer as the source.

* * * * *